(12) United States Patent
Kobayashi

(10) Patent No.: US 8,209,645 B2
(45) Date of Patent: Jun. 26, 2012

(54) SYSTEM AND METHOD FOR CONVERTING A SYNCHRONOUS FUNCTIONAL CIRCUIT TO AN ASYNCHRONOUS FUNCTIONAL CIRCUIT

(75) Inventor: Hidetomo Kobayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 332 days.

(21) Appl. No.: 12/565,955

(22) Filed: Sep. 24, 2009

(65) Prior Publication Data
US 2010/0083207 A1      Apr. 1, 2010

(30) Foreign Application Priority Data
Sep. 26, 2008   (JP) .................................. 2008-247509

(51) Int. Cl.
    G06F 17/50      (2006.01)
(52) U.S. Cl. ........ 716/103; 716/100; 716/102; 716/108; 716/113; 716/132; 716/134; 716/139
(58) Field of Classification Search .......... 716/100–108, 716/110–110, 113, 132, 134, 139
    See application file for complete search history.

(56) References Cited

U.S. PATENT DOCUMENTS

| | | | | |
|---|---|---|---|---|
| 5,067,091 A | * | 11/1991 | Nakazawa | 716/103 |
| 6,088,821 A | * | 7/2000 | Moriguchi et al. | 714/724 |
| 7,418,676 B2 | * | 8/2008 | Karaki et al. | 716/103 |
| 7,584,449 B2 | * | 9/2009 | Beerel et al. | 716/104 |
| 7,610,567 B2 | * | 10/2009 | Manohar | 716/103 |
| 7,739,628 B2 | * | 6/2010 | Manohar et al. | 716/103 |
| 2006/0120189 A1 | * | 6/2006 | Beerel et al. | 365/203 |

FOREIGN PATENT DOCUMENTS

JP         9-231259         9/1997

* cited by examiner

*Primary Examiner* — Nghia Doan
(74) *Attorney, Agent, or Firm* — Husch Blackwell LLP

(57) ABSTRACT

A hierarchizing means 101 for blocking, of a first description which represents a functional circuit in an RTL, a second description and for converting the first description into a hierarchized third description; a first logic synthesis means 102 for logic synthesis of the third description; a first placement and routing means 103 for first placement and routing; a first substitution means 104 for substituting a fourth description indicating the unit circuit which is asynchronous for the second description; a second logic synthesis means 105 for logic synthesis of the fourth description; a second placement and routing means 106 for second placement and routing; a calculation means 107 for calculating a circuit on which the second placement and routing is performed; and a second substitution means 108 for substituting the circuit on which placement and routing is performed by the second placement and routing means 106 for a selected circuit on which placement and routing is performed by the first placement and routing means 103.

6 Claims, 15 Drawing Sheets

SYSTEM AND METHOD FOR CONVERTING A SYNCHRONOUS FUNCTIONAL CIRCUIT TO AN ASYNCHRONOUS FUNCTIONAL CIRCUIT

BACKGROUND OF THE INVENTION

1. Field of the Invention

The present invention relates to a design system of a functional circuit. In addition, the present invention relates to a method for designing a functional circuit. The present application claims priority under 35 USC §119 to Japanese application serial no. 2008-247509 filed Sep. 26, 2008 in Japan.

2. Description of the Related Art

In recent years, research and development of semiconductor devices in which transistors formed using polycrystalline semiconductors or the like are used for switching elements of pixel portions or driver circuits of pixels have been actively conducted.

Further, semiconductor devices in which display elements and functional circuits which are formed using the transistors are formed over the same substrate have been researched and developed. As the functional circuits, for example, CPUs, image processing circuits, memories, or the like can be given. In order to enhance added value of the semiconductor device, for example, improvement in processing capability, reduction in area, and decrease in power consumption, or the like is required for the functional circuit.

Focusing on the efficiency of design, functional circuits are generally designed by synchronous design. In synchronous design in recent years, circuits are represented with a hardware description language of register transfer level which conforms to IEEE standards, a net list which indicates a functional circuit is generated with a use of a logic synthesizer, and a layout is designed based on the generated net list with a use of an automatic placement and routing tool while an operation timing is considered. A functional circuit manufactured by such a design method is a synchronous circuit in which each unit circuit inside the functional circuit operates by synchronizing with a clock signal. Note that a description in a hardware language at the register transfer level is also referred to as an RTL description in this document.

On the other hand, a functional circuit in which each unit circuit inside does not operate by synchronizing with a clock signal is referred to as an asynchronous circuit.

The synchronous circuit is characterized by high efficiency of design and a large circuit scale or high power consumption as compared to the asynchronous circuit. On the other hand, the asynchronous circuit is characterized by low efficiency of design, accumulation of delays, and a small circuit scale or low power consumption. Accordingly, a functional circuit which has an advantage of the asynchronous circuit by making part of the functional circuit asynchronous while an advantage of the synchronous circuit is maintained (hereinafter such a functional circuit is referred to as an asynchronous substitutional functional circuit), and design of such a functional circuit are desired.

In the case where a functional circuit to be designed is the above-described asynchronous substitutional functional circuit, the functional circuit has been designed by a design method in which an asynchronous unit circuit is manually substituted for a synchronous unit circuit (such a design method is also referred to as a hand design). However, circuit design by the above-described hand design has a problem in that the efficiency of design and reliability are low. As a method for solving the problem, the following is suggested: a design aid device which extracts a description which indicates a certain unit circuit (e.g., a description which indicates a binary counter circuit) from an RTL description which represents circuits and automatically substitutes a corresponding description which indicates an asynchronous circuit (e.g., a description which indicates an asynchronous binary counter circuit) for the extracted description (for example, Patent Document 1).

[Reference]
[Patent Document ]
[Patent Document 1] Japanese Published Patent Application No. H9-231259

However, with a conventional design method including that disclosed in Patent Document 1, delays are accumulated in the asynchronous circuit. Therefore, if a description indicating an asynchronous circuit is substituted for a description indicating a synchronous circuit, it is difficult to pass timing verification in designing a layout in some cases. Note that to "pass" above means that the result of the timing verification in designing the layout is correct.

Here, the conventional design method of an asynchronous substitutional functional circuit will be described in detail with reference to FIG. 14 and FIG. 15.

FIG. 14 is a flow chart of synchronous circuit design. As shown in FIG. 14, in the conventional synchronous circuit design, logic is synthesized by using an RTL description which represents a circuit as a first step (s1 in FIG. 14); then, placement and routing is performed as a second step (s2 in FIG. 14); timing verification is performed as a third step (s3 in FIG. 14); and the design is completed in the case of passing the timing verification in a fourth step (s4 in FIG. 14). Note that the placement and routing in the second step and the timing verification in the third step are collectively referred to as layout design. In addition, the completion of the design means a state in which masks can be ordered. Further, in the case where the timing verification cannot be passed, the flow goes back to a stage of generating an RD, description as a fifth step (s5 in FIG. 14) to perform appropriate correction. This flow is the conventional synchronous circuit design.

On the other hand, FIG. 15 is a flow chart of the design of the asynchronous substitutional functional circuit disclosed in Patent Document 1. As shown in FIG. 15, in the design of the asynchronous substitutional functional circuit disclosed in Patent Document 1, as a first step (s0 in FIG. 15), an RTL description which represents an asynchronous substitutional functional circuit is generated by extracting a description which indicates a certain unit circuit (a description which indicates a synchronous binary counter circuit) from an RTL description which represents circuits and automatically substituting a description of a corresponding asynchronous circuit (a description which indicates an asynchronous binary counter circuit) for the extracted description of the certain unit circuit. After that, like the flow chart in FIG. 14, logic is synthesized by using the generated RTL description that represents the asynchronous substitutional functional circuit as a second step (s1 in FIG. 15); placement and routing is performed as a third step (s2 in FIG. 15); a layout is designed by timing verification as a fourth step (s3 in FIG. 15); and the design is completed in the case of passing the timing verification in a fifth step (s4 in FIG. 15). Further, in the case where the verification of the timing cannot be passed, the flow goes back to a stage of generating an RTL description as a sixth step (s5 in FIG. 15) to perform appropriate correction. This flow is the design of the asynchronous substitutional functional circuit disclosed in Patent Document 1.

As described above, in designing the asynchronous substitutional functional circuit, as compared to the original RTL description, there is a high possibility that the RTL description generated by the substitution process cannot pass the timing verification in designing the layout due to accumulation of delays in the asynchronous circuit. However, depending on characteristics of a device or a circuit configuration, the timing verification in designing the layout is passed in some cases even when delays are accumulated. Therefore, whether the timing verification is passed or not cannot be determined at the time of synthesizing logic. In other words, a possibility that the flow goes back to a stage of generating an RTL description to perform appropriate correction after the design step proceeds up to layout design is higher than that of the conventional synchronous circuit design, which leads to a problem of waste of time. There is concern that the waste of time for design may indirectly cause decrease in efficiency of design and increase in a circuit scale or power consumption depending on demand for design from market forces and the like.

SUMMARY OF THE INVENTION

In view of the above problems, an object according to one embodiment of the present invention is to suppress decrease in the efficiency of design by reducing the waste of time for design in designing an asynchronous substitutional functional circuit, and to design a functional circuit with a small circuit scale and low power consumption.

According to one embodiment of the present invention, a system for designing a functional circuit includes a hierarchizing means for blocking, of a first description which represents a functional circuit at a register transfer level, a second description indicating a synchronous unit circuit, and converting the first description into a hierarchized third description with a use of the blocked second description as one class; a first logic synthesis means for generating a first net list by logic synthesis of the third description; a first placement and routing means for placement and routing based on the first net list; a first substitution means for substituting a fourth description indicating an asynchronous unit circuit for the blocked second description; a second logic synthesis means for generating a second net list by logic synthesis of the fourth description; a second placement and routing means for placement and routing based on the second net list; a calculation means for calculating the asynchronous unit circuit on which the placement and routing is performed by the second placement and routing means; and a second substitution means for selectively substituting the asynchronous unit circuit on which the placement and routing is performed by the second placement and wiring means for the synchronous unit circuit on which the placement and routing is performed by the first placement and routing means based on a calculation result by the calculation means.

According to one embodiment of the present invention, in a method for designing a functional circuit, by extracting and blocking a second description indicating a synchronous unit circuit from a first description representing a functional circuit at the register transfer level, the first description is converted into a hierarchized third description with a use of the blocked second description as one class; a first net list is generated by logic synthesis of the third description; a first placement and routing process is performed based on the first net list; a fourth description indicating the unit circuit which is asynchronous is substituted for the blocked second description; a second net list is generated by logic synthesis of the fourth description; a second placement and routing process is performed based on the second net list; a calculation process is performed on the asynchronous unit circuit on which the second placement and routing process is performed; and the asynchronous unit circuit on which the second placement and routing process is performed is selectively substituted for the synchronous unit circuit on which the first placement and routing process is performed based on a calculation result of the calculation process.

Note that, according to one embodiment of the present invention, each of the synchronous unit circuit and the asynchronous unit circuit may be a counter circuit including a sequential circuit.

Note that, according to one embodiment of the present invention, timing verification may be performed by the first placement and routing process on the synchronous unit circuit on which placement and routing is performed by the first placement and routing process.

Note that, according to one embodiment of the present invention, timing verification may be performed by the calculation means on the asynchronous unit circuit on which placement and routing is performed by the second placement and routing process.

According to one embodiment of the present invention, in designing an asynchronous substitutional functional circuit, by automatically asynchronizing any of synchronous circuits after placement and routing, waste of time for design can be suppressed and decrease in the efficiency of the design can be suppressed. Further, according to one embodiment of the present invention, an asynchronous substitutional functional circuit with a small circuit scale and low power consumption can be designed.

DETAILED DESCRIPTION OF THE INVENTION

[Embodiment 1]

In this embodiment, a design system of a functional circuit, which is one embodiment of the present invention, will be described.

Figure 1:
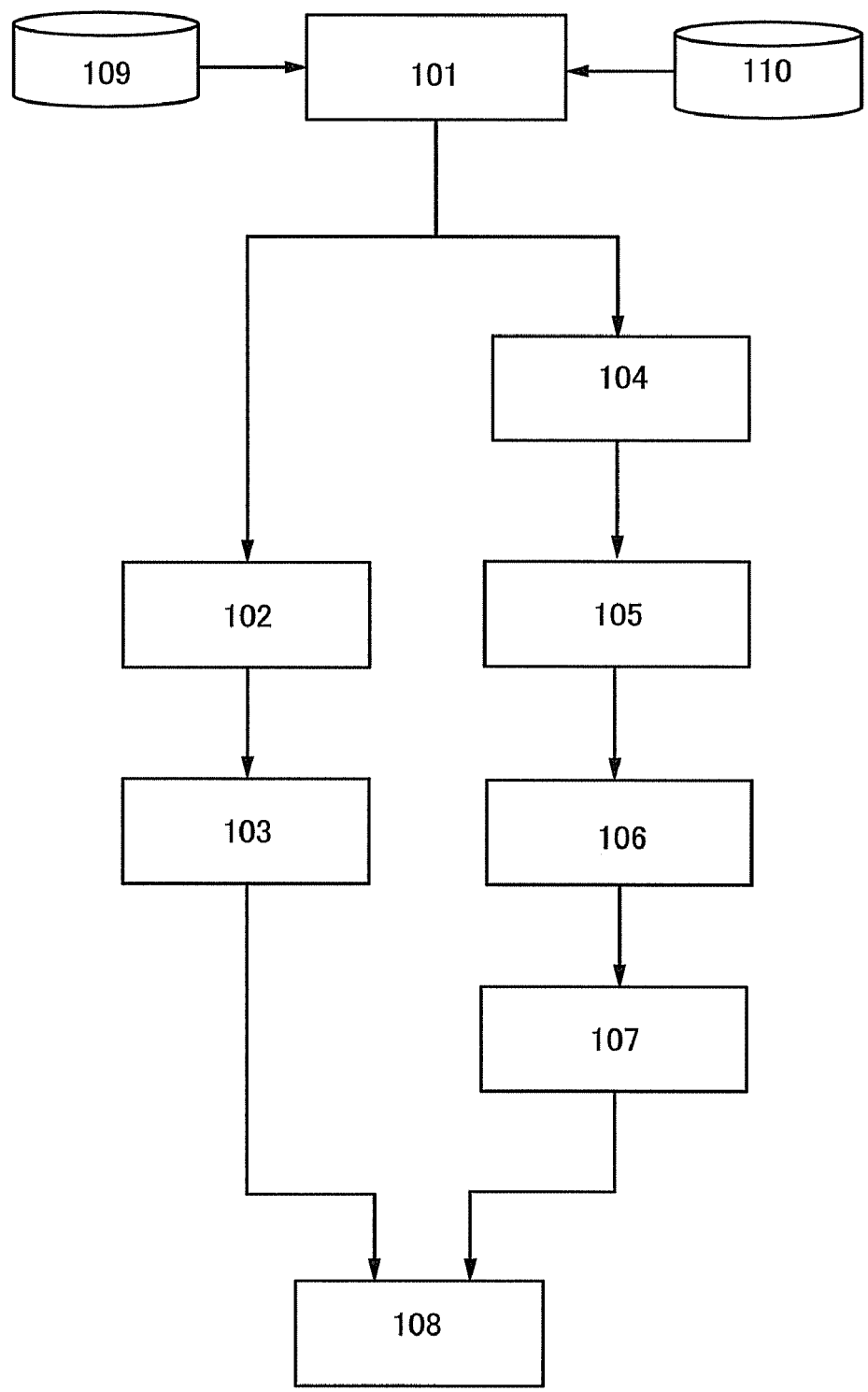
FIG. 1 is a block diagram illustrating a structure of a design system of a functional circuit in Embodiment 1.

First, a design system of a functional circuit in this embodiment will be described with reference to FIG. 1. FIG. 1 is a block diagram illustrating a structure of the design system of a functional circuit in this embodiment.

As shown in FIG. 1, the design system of the functional circuit in this embodiment includes a hierarchizing means 101, a first logic synthesis means 102, a first placement and routing means 103, a first substitution means 104, a second logic synthesis means 105, a second placement and routing means 106, a calculation means 107, and a second substitution means 108. Note that each means can be formed by a program, for example.

The hierarchizing means 101 blocks a description which indicates a synchronous unit circuit in an RTL description 109 (also referred to as a first description) and converts the RTL description 109 to a hierarchized KM description (also referred to as a third description) with a use of the blocked second description as one class. Note that the term "hierarchization" means conversion of a description which indicates a circuit to a description including a plurality of classes. In specific, hierarchization means to search the RTL description 109 for a description corresponding to assigned circuit information 110, block the RTL description corresponding to the assigned circuit information 110, and convert the RTL description 109 to the hierarchized RTL description with a use of the blocked description as one class.

Figure 2:
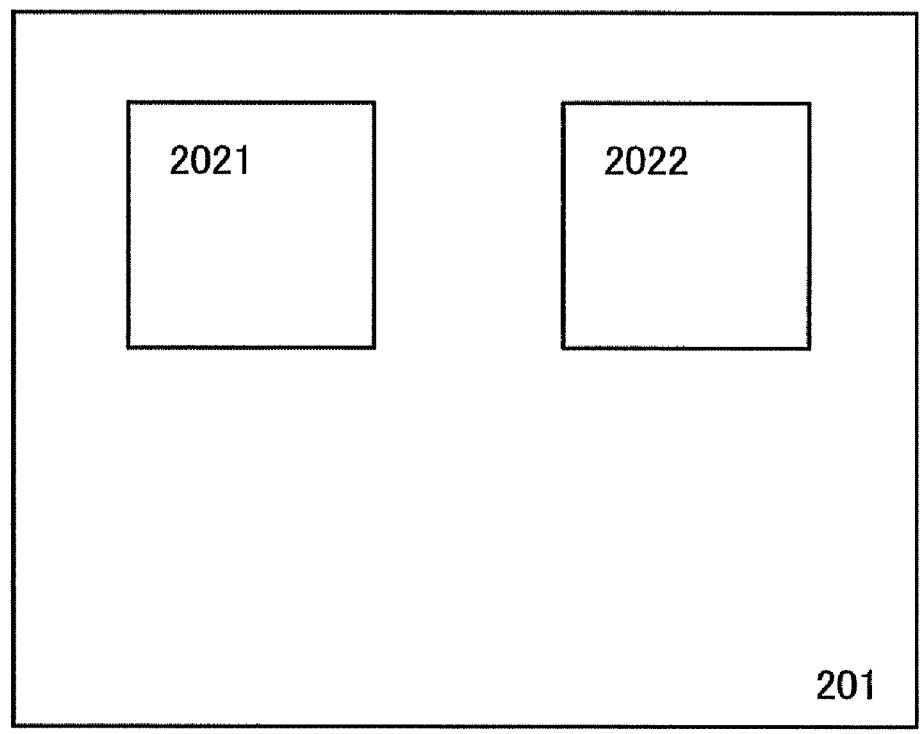
FIG. 2 is a block diagram illustrating a hierarchy.

Note that the hierarchized RTL description represents the same circuit function as the RTL description 109 and the RTL description further hierarchized is classified into a description in a higher class and a description in a lower class. The description in the lower class includes the blocked second description. The description in the higher class includes the description in the lower class, a description indicating the other circuits, and a description of connection relation between the description in the lower class and the description of the other circuits. For example, as shown in FIG. 2, in the case where a description indicating a functional circuit 201 is in a higher class, a description indicating a unit circuit 2021 and a unit circuit 2022 are blocked and the unit circuit 2021 and the unit circuit 2022 each represented as a circuit block are descriptions in a lower class. Note that a description in a higher class in this embodiment is a description indicating the functional circuit 201 unless otherwise stated, and a description in a lower class is a description indicating the unit circuit 2021 and the unit circuit 2022 unless otherwise stated.

The RTL description 109 represents a circuit by an RTL description conforming to the IEEE standard which is appropriate for a design method of a synchronous circuit. In addition, a circuit represented by the RTL description 109 operates entirely by a global clock. As a circuit represented by the RTL description 109, for example, a CPU, an image processing circuit, or a memory can be given. Such a circuit generally includes a group of circuits such as a counter circuit and a selector circuit. In this document, a description that indicates a CPU, an image processing circuit, or a memory is in a higher class and a description that indicates a counter circuit or a selector circuit is in a lower class.

The assigned circuit information 110 indicates the same circuit as a certain unit circuit (e.g., a synchronous counter circuit) indicated by a description extracted from the RTL description 109. Note that since the assigned circuit information 110 is for extracting a part that corresponds to an assigned circuit from the RTL description 109 by the hierarchizing means 101, the format of the assigned circuit information 110 is preferably set in accordance with the hierarchizing means 101. For example, in the hierarchizing means 101, in the case of searching the RTL description 109 for a part that corresponds to the assigned circuit information 110 with a keyword, a format in which the assigned circuit information 110 represents a certain unit circuit with the keyword is set.

The first logic synthesis means 102 performs logic synthesis of an RTL description which is hierarchized by the hierarchizing means 101 and generates a net list at the gate level (such a net list is also referred to as a first net list). For the logic synthesis, a constraint condition such as the area of a chip or a delay time, or a library's cell of a semiconductor manufacturing technology is also used. In addition, as a logic synthesizer, for example, Build Gates manufactured by Cadence Design Systems Inc., or the like can be used.

The first placement and routing means 103 performs placement and routing based on the net list generated by the first logic synthesis means 102 and generates a net list at the gate level. Note that placement and routing is to place and further route a circuit over a two-dimensional plane based on the net list. Note that a constraint condition such as the area of a chip or a delay time, or a library's cell of a semiconductor manufacturing technology is used for placement and routing in some cases. Further, timing verification is also performed in the first placement and routing means 103; timing information such as a set-up time or a hold time is output to the second substitution means 108. In the timing verification, not only conventional timing verification but also timing verification in which a unit circuit which corresponds to a description in a lower class is treated as one combination circuit is performed at the same time in addition to timing verification for between elements in a circuit included in the unit circuit that corresponds to the description in the lower class; and timing information of an input/output terminal of the unit circuit that corresponds to the description in the lower class is output to the second substitution means 108. Note that the timing information of the input/output terminal of the unit circuit that corresponds to the description in the lower class refers to delay information between sequential circuits, gate capacitance loaded on a circuit or parasitic capacitance loaded on a wiring, or the like unless otherwise stated.

The first substitution means 104 substitutes a description indicating an asynchronous unit circuit (such a description is also referred to as a fourth description) for the second description which is hierarchized by the hierarchizing means 101. Note that the second description and the fourth description are different from each other only in that the second description indicates the synchronous circuit and the fourth description indicates the asynchronous circuit and represent the same circuit function.

The second logic synthesis means 105 performs logic synthesis of the fourth description and generates a net list at the gate level (such a net list is also referred to as a second net list). For the logic synthesis, a constraint condition such as the area of a chip or a delay time, or a library's cell of a semiconductor manufacturing technology is also used. As a logic synthesizer, for example, Build Gates manufactured by Cadence Design Systems Inc., or the like can be used.

The second placement and routing means 106 performs placement and routing based on the net list generated by the second logic synthesis means 105. Note that a constraint condition such as the area of a chip or a delay time, or a library's cell of a semiconductor manufacturing technology is used for placement and routing in some cases. Further, circuit information such as wiring connection information, gate capacitance, or parasitic capacitance loaded on a wiring is generated in the second placement and routing means 106 and is output to the calculation means 107.

The calculation means 107 is also referred to as a simulation means. With the use of a circuit simulator such as SPICE, the calculation means 107 performs calculation (also referred to as simulation) by using circuit information, which is input from the second placement and routing means 106, such as wiring connection information, gate capacitance, or parasitic capacitance loaded on a wiring, and a net list input from the second placement and routing means 106. The calculation is performed by changing calculation conditions at that time: a combination of input signals, a slope of rise or fall of the input signal, or load capacitance in an output terminal, for example. For example, when there are four conditions of a combination of the value of the input signal, five conditions of a slope of the rise or fall of the input signal, and five conditions of load capacitance in the output terminal, calculation is performed 100 times: 4×5×5. Through the calculation, delay information corresponding to the input net list is obtained and the result of the calculation is output as a data table to a file. Further, timing verification is performed in the calculation means 107 as a substitution for timing verification which has not been performed in the second placement and routing means 106. Timing verification is roughly classified into dynamic timing verification and static timing verification.

Here, a difference between the dynamic timing verification and the static timing verification will be described. The dynamic timing verification is to perform calculation by actually inputting a test pattern into a circuit and check if there is malfunction in operation of a circuit based on an output state of the calculation. If there is malfunction, the dynamic timing verification modifies the operation so as to make the circuit normally operate.

On the other hand, the static timing verification is to check if there is abnormality in a delay relation between a reference clock signal and data only based on circuit information such as wiring connection information, gate capacitance, or parasitic capacitance loaded on a wiring. If there is abnormality, the static timing verification modifies the delay relation to obtain a normal delay relation. Note that the timing verification disclosed in this specification is static timing verification unless otherwise stated. In the case of a synchronous circuit, static timing verification can be employed because verification is possible based on timing of a delay value, which is obtained by calculation of a critical path between sequential circuits, and a reference clock signal (for example, time based on the cycle of the clock signal or delay of the clock signal). However, in the case of an asynchronous circuit, a reference clock signal may not be supplied to all sequential circuits, verification based on timing of a delay value, which is obtained by calculation of a critical path between sequential circuits, and a reference clock signal is impossible. Accordingly, dynamic timing verification is required for the asynchronous circuit; therefore, dynamic timing verification is performed in the calculation means 107 as timing verification. Note that a commercial cell characterize tool is used as part of the calculation means 107. As the cell characterize tool, for example, AccuCell manufactured by SILVACO JAPAN Co., Ltd., or the like can be used.

The second substitution means 108 substitutes a circuit placed by the second placement and routing means 106 for part of circuits placed by the first placement and routing means 103, for example, a selected unit circuit in a lower class based on the calculation result in the calculation means 107. Further, in the second substitution means 108, timing verification is performed again with a layout in which substitution is completed.

Figure 3:
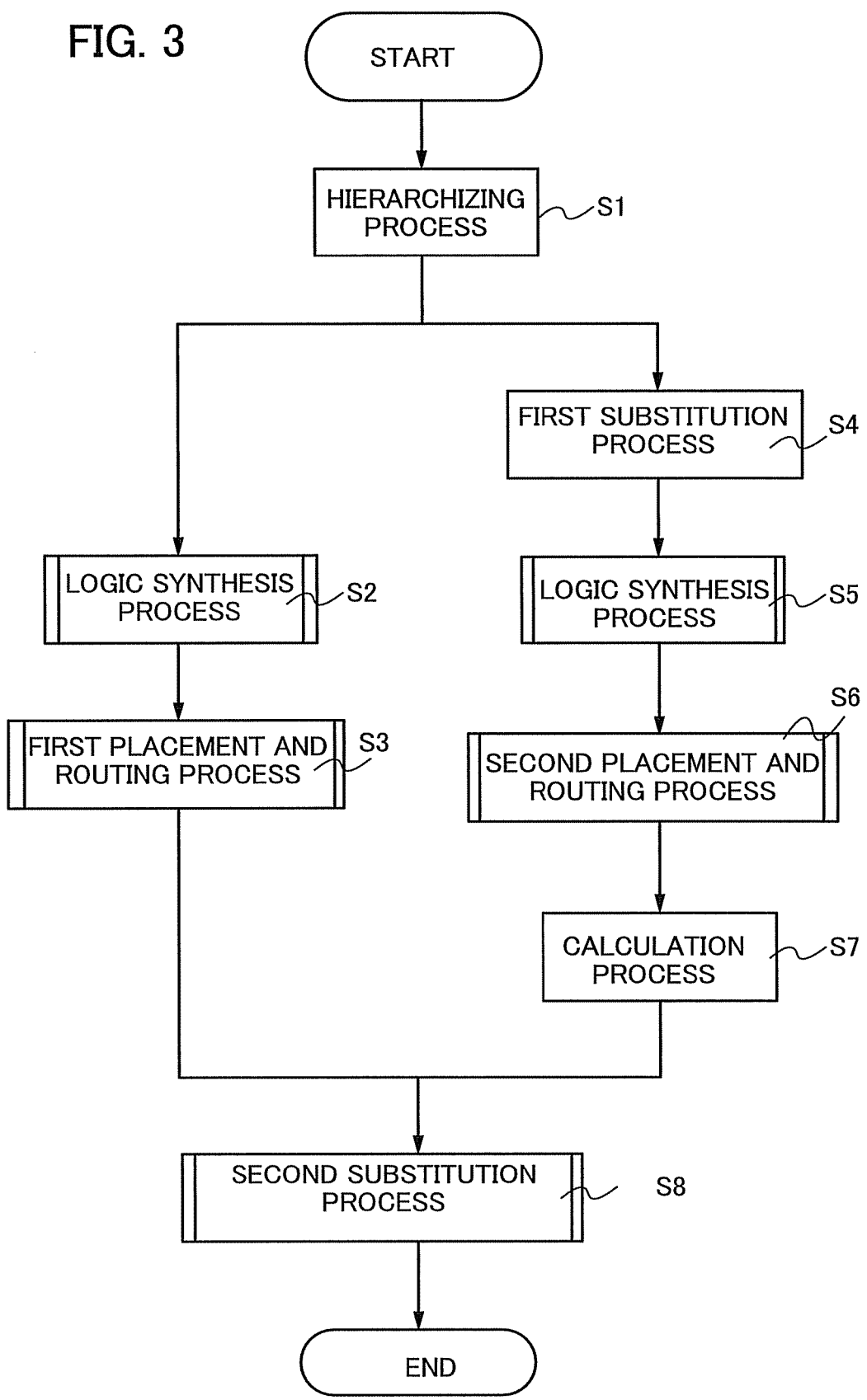
FIG. 3 is a flow chart illustrating a method for designing a functional circuit in Embodiment 1.

Next, a design method of a functional circuit with the use of the above-described design system will be described with reference to FIG. 3. FIG. 3 is a flow chart illustrating a design method with the use of the design system in this embodiment.

As shown in FIG. 3, a hierarchizing process is performed in the hierarchizing means 101 as a first step (S1 in FIG. 3). In the hierarchizing process, of the RTL, description 109, a description which corresponds to a certain unit circuit described in the assigned circuit information 110 is blocked and the RTL description 109 is converted into a hierarchized RTL description by using the blocked description as one class.

After the hierarchizing process, two processes of a process using the hierarchized RTL description and a process using a description which indicates the blocked unit circuit in a lower class are performed. Each process will be described below.

In the process using the hierarchized RTL description, a logic synthesis process is performed by the first logic synthesis means 102 as a second step (S2 in FIG. 3) after the hierarchizing process. The logic synthesis process will be specifically described with reference to FIG. 4.

Figure 4:
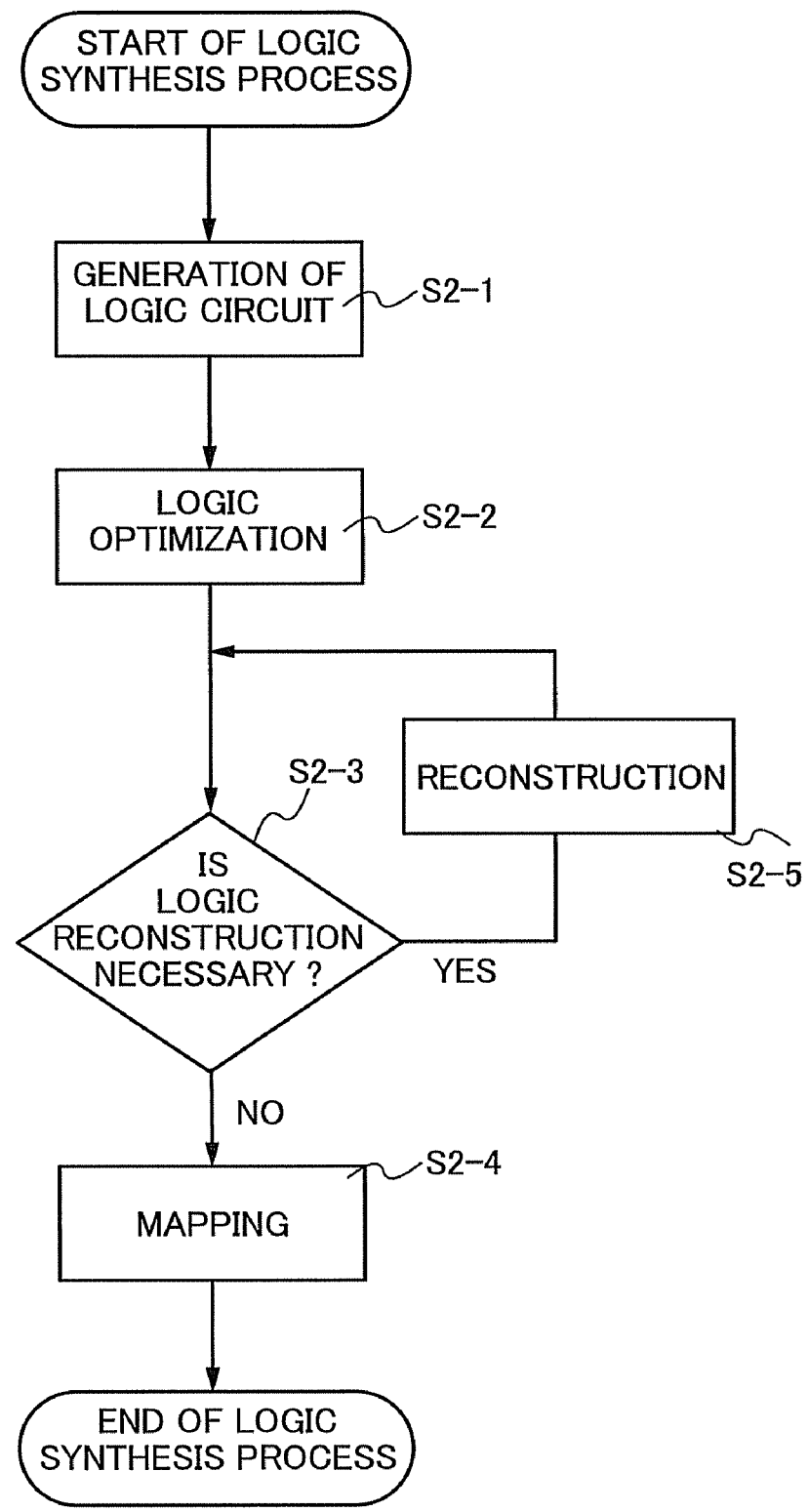
FIG. 4 is a flow chart illustrating a first logic synthesis process in Embodiment 1.

As shown in FIG. 4, a logic circuit is formed as a step 1 (S2-1 in FIG. 4). Here, a logic circuit at the gate level is formed by assignment of a state code of a state machine, assignment of a flip-flop, generation of combination logic, or the like based on the input RTL description 109.

Next, as a step 2 (S2-2 in FIG. 4), logic is optimized as far as the optimization does not depend on a semiconductor manufacturing process. In specific, the number of logic gates (the area of a chip) and the number of logic stages (delay time) are adjusted so as to meet a constraint condition assigned. For example, deletion of redundant logic in which a property of Boolean algebra such as a+a×b=a is used, expansion of logic in which logic such as f=(a+b)×(c+d) is expanded to f=a×c+a×d+b×c+b×d, making multi-level logic in which logic such as f=a×c+a×d+b×c+b×d is made f=(a+b)×(c+d), or the like is performed. Note that a,b,c, d, and f each represent a set.

Further, as a step 3, (S2-3 in FIG. 4), whether reconstruction of logic without change of the whole logic function is necessary or not is determined. The reconstruction of logic is to substitute logic having the same function and a different structure for the logic. Logic is reconstructed in order to make parameters which represent a delay relation between a reference clock signal and data converge on a predetermined value or to reduce the scale of a circuit. If reconstruction is necessary, logic is reconstructed as a step 5 (S2-5 in FIG. 4).

Finally, as a step 4 (S2-4 in FIG. 4), mapping into a prepared library's cell of a semiconductor manufacturing technology is conducted. In other words, a prepared library's macrocell of a semiconductor manufacturing technology is substituted for logic (gate) or a sequential circuit. Through these steps, the net list at the gate level is generated. Note that the RTL description hierarchized by the hierarchizing means 101 is kept hierarchized in the logic synthesis process. The steps up to here are the logic synthesis process.

Figure 5:
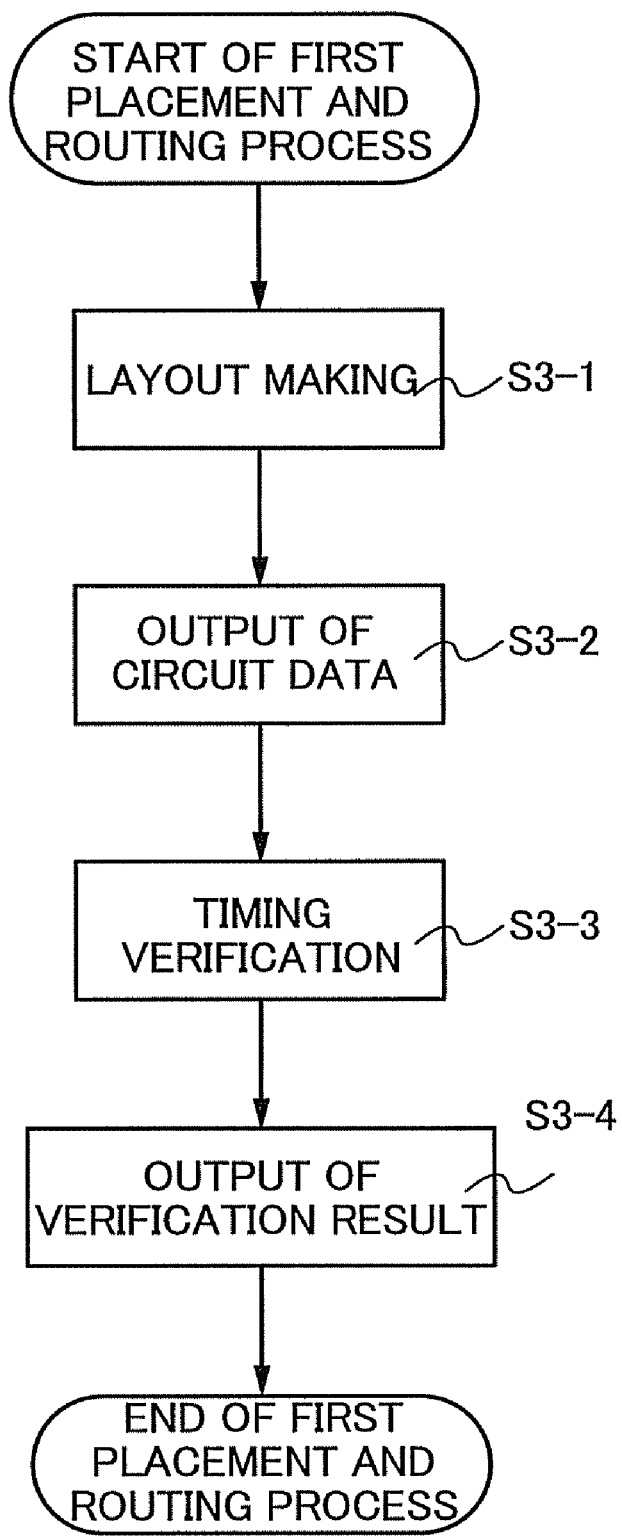
FIG. 5 is a flow chart illustrating a first placement and routing process in Embodiment 1.

Next, as a third step (S3 in FIG. 3), a first placement and routing process is performed by the first placement and routing means 103. The first placement and routing process will be specifically described with reference to FIG. 5. FIG. 5 shows a flow chart illustrating the first placement and routing process in this embodiment.

As shown in FIG. 5, as a step 1 (S3-1 in FIG. 5), a layout is formed by using the net list at the gate level, which is generated by the first logic synthesis means 102, constraint conditions such as the area of a chip and a delay time, a library's cell of the semiconductor manufacturing technology, and the like, whereby a net list at the gate level is generated.

Next, as a step 2 (S3-2 in FIG. 5), circuit data such as wiring connection information, gate capacitance, or parasitic capacitance loaded on a wiring is output to the second substitution means 108.

Next, as a step 3 (S3-3 in FIG. 5), timing verification is performed. As a step 4 (S3-4 in FIG. 5), timing information such as a set-up time or a hold time of each of circuits which are included in a functional circuit is output to the second substitution means 108. Note that in the timing verification in the first placement and routing process, not only conventional timing verification but also timing verification in which a unit circuit is treated as one combination circuit is performed at the same time in addition to timing verification for between elements in a sequential circuit included in the unit circuit which corresponds to a description in a lower class; and timing information of an input/output terminal of the unit circuit is output to the second substitution means 108. Note that the timing information is output in a manner described below.

First, a graph which corresponds to an object circuit is formed based on delay time information and wiring delay time information of each element (a logic gate or a transistor) by using the generated net list. Then, a path of the maximum delay time, a path of the minimum delay time, or the like is extracted from the graph; and timing information is generated based on the path of the maximum delay time or minimum delay time. Here, the graph is a graph based on graph theory that conceptualizes points abstracted focusing on a way of connection of each element (a logic gate or a transistor), and lines which connects those points.

The steps up to here are the first placement and routing process. Note that hierarchization by the hierarchizing means is maintained in the first placement and routing process. Further, elements in a unit circuit in a lower class are preferably placed as close as possible to each other.

On the other hand, for a process using a blocked description indicating a unit circuit in a lower class in the hierarchized RTL description, the first substitution process is performed as a second step (S4 in FIG. 3) after the hierarchization process. The first substitution process is described below.

In the first substitution process, a description indicating asynchronous unit circuit separately formed is substituted for the blocked description indicating the unit circuit. Here, the description indicating the asynchronous unit circuit separately formed and the blocked description indicating the unit circuit to be replaced represent the same function. Note that the description indicating the asynchronous unit circuit can be formed in the first substitution process. Alternatively, the description indicating the asynchronous unit circuit can be described in advance in the assigned circuit information 110 which is used for the hierarchization process to be used in the first substitution process. The steps up to here are the first substitution process.

Next, as a third step (S5 in FIG. 3), a logic synthesis process is performed on the description indicating the asynchronous unit circuit by the second logic synthesis means 105, so that a net list at the gate level is generated. Since the specific description of the logic synthesis process is the same as that of the logic synthesis process in the second step (S2 in FIG. 3), the description of the logic synthesis process in the second step (S2 in FIG. 3) is quoted.

Figure 6:
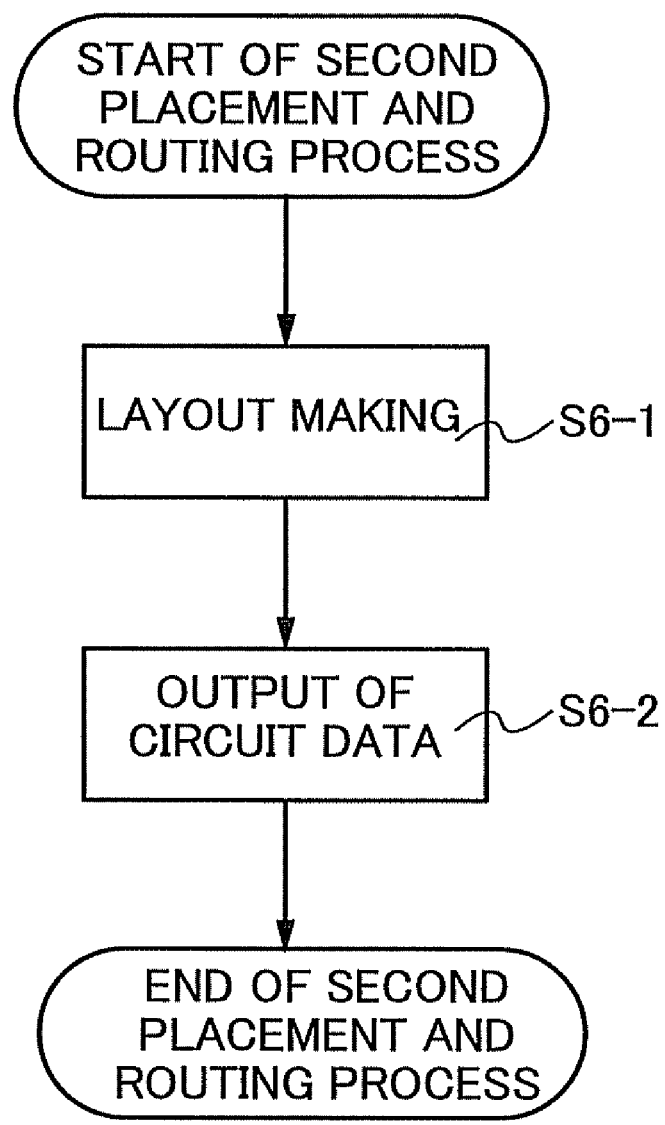
FIG. 6 is a flow chart illustrating a second placement and routing process in Embodiment 1.

Next, as a fourth step (S6 in FIG. 3), a second placement and routing process is performed by the second placement and routing means 106. The second placement and routing process will be specifically described with reference to FIG. 6. FIG. 6 is a flow chart illustrating the second placement and routing process in this embodiment.

As shown in FIG. 6, as a step 1 (S6-1 in FIG. 6), a layout is formed by using the net list, which is generated by the second logic synthesis means 105, constraint conditions such as the area of a chip and a delay time, a library's cell of the semiconductor manufacturing technology, and the like, whereby a net list at the gate level is generated.

Next, as a step 2 (S6-2 in FIG. 6), circuit data such as wiring connection information, gate capacitance, or parasitic capacitance loaded on a wiring is output to the calculation means 107. The steps up to here are the second placement and routing process.

Next, as a fifth step (S7 in FIG. 3), a calculation process is performed by the calculation means 107. In the calculation process, calculation is performed by using circuit information such as wiring connection information, gate capacitance, parasitic capacitance loaded on a wiring, which are input from the second placement and routing means 106, and the net list input from the second placement and routing means 106. Through the calculation, delay information corresponding to the input net list is obtained and the result of the calculation is output as a data table to a file. Further, timing verification is performed in the calculation means 107.

Figure 7:
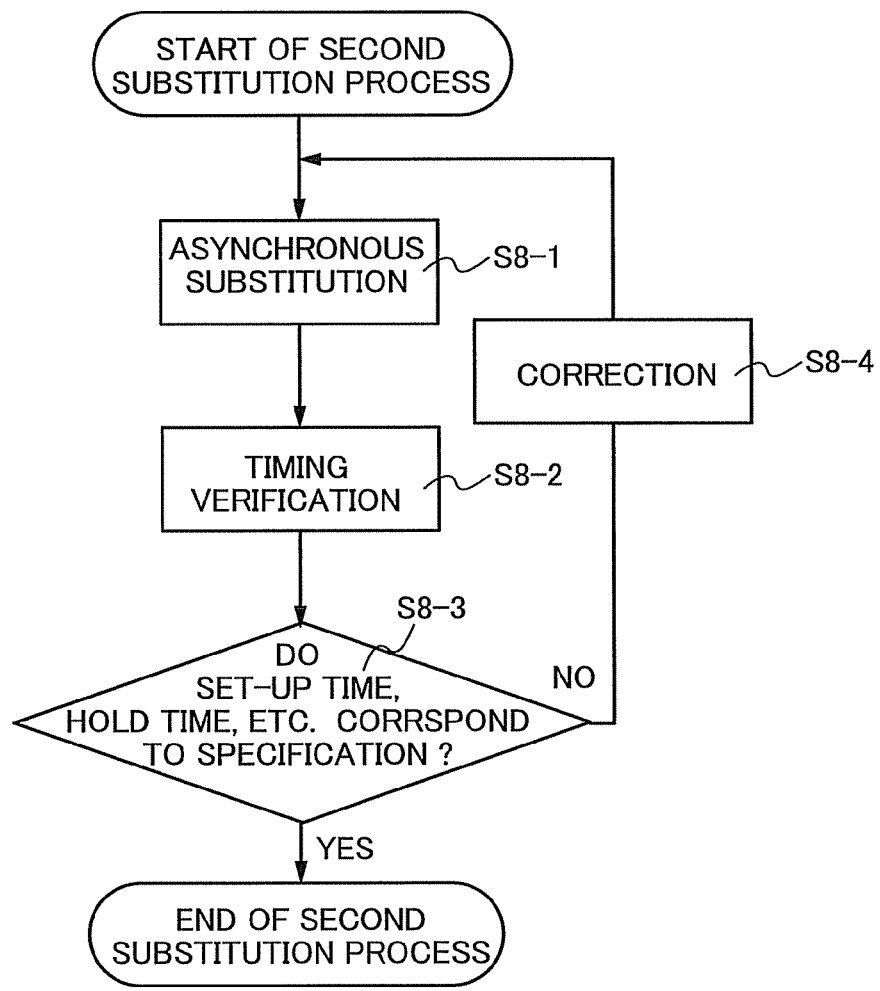
FIG. 7 is a flow chart illustrating a second substitution process in Embodiment 1.

When the first placement and routing process and the calculation process have been completed, a second substitution process is performed by the second substitution means 108 as the next step (S8 in FIG. 3). The second substitution process is specifically described with reference to FIG. 7. FIG. 7 is a flow chart illustrating the second substitution means in this embodiment.

As shown in FIG. 7, as a step 1 (S8-1 in FIG. 7), based on output delay information obtained by the calculation means 107 and timing information of the input/output terminal of the unit circuit in the lower class input from the first placement and routing means 103, a circuit corresponding to the description indicating the asynchronous unit circuit placed by the second placement and routing means 106 is substituted for a selected circuit corresponding to the description in the lower class placed by the first placement and routing means 103 in a layout.

Next, as a step 2 (S8-2 in FIG. 7), timing verification is performed again with the layout in which the substitution has been completed. Further, as a step 3 (S8-3 in FIG. 7), whether a set-up time, a hold time, or the like corresponds to a desired timing specification or not is checked. If the set-up time, the hold time, or the like corresponds to the desired timing specification, design is completed. Note that the timing specification is a value which is used for judgment of acceptance of timing verification. If the set-up time, the hold time, or the like does not correspond to the desired timing specification, appropriate modification is conducted as a step 4 (S8-4 in FIG. 7). The steps up to here are the second substitution process.

In this manner, a synchronous circuit is selectively automatically asynchronized after placement and routing in the design system of a functional circuit according to one embodiment of the present invention. Therefore, modification is easy even when timing verification cannot be passed, waste of time for design can be reduced, and decrease in design efficiency can be suppressed. Further, a functional circuit with a small circuit scale and low power consumption can be designed by a simple method in which the synchronous circuit is selectively asynchronized.

[Embodiment 2]

In this embodiment, a semiconductor device will be described as an example of a device provided with a circuit which can be designed by the design system of a functional circuit or the method for designing a functional circuit, according to one embodiment of the present invention.

Figure 8:
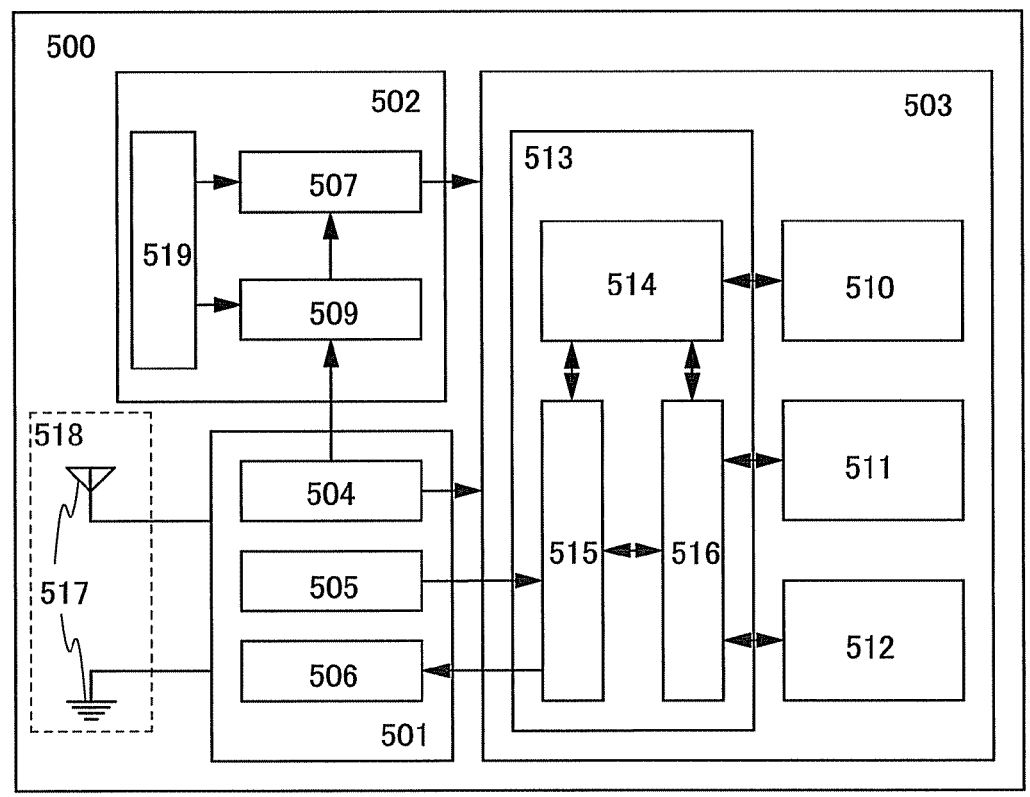
FIG. 8 is a block diagram illustrating a structure of a semiconductor device provided with a circuit which can be designed by the present invention in Embodiment 2.

A structure of the semiconductor device in this embodiment will be described with reference to FIG. 8. FIG. 8 is a block diagram illustrating the structure of the semiconductor device in this embodiment.

As shown in FIG. 8, a semiconductor device 500 includes an RF circuit 501, a clock signal generation circuit 502, a logic circuit 503, and an antenna 517 in an antenna portion 518. Note that, although not shown in FIG. 8, the semiconductor device 500 transmits and receives a radio signal to and from an external circuit such as a wireless communication device (a device capable of wireless communication, such as a reader/writer or an interrogator) via the antenna 517. Note that data transmission methods are roughly classified into the following three methods: an electromagnetic coupling method, in which a pair of coils is provided so as to be faced with each other and communicates with each other by mutual induction, an electromagnetic induction method, in which communication is performed using an induction field, and an electromagnetic wave method, in which communication is performed using an electromagnetic wave. Any of these methods can be used in this embodiment.

Next, a structure of each circuit will be described. The RF circuit 501 includes a power supply circuit 504, a demodulation circuit 505, and a modulation circuit 506. In addition, the clock signal generation circuit 502 includes a divider circuit 507, a counter circuit 509, and a reference clock signal generation circuit 519. In addition, the logic circuit 503 has a function of arithmetic processing and includes a controller 513, a CPU (also referred to as a central processing circuit) 510, a ROM (read only memory) 511, and a RAM (random access memory) 512.

The controller 513 includes a CPU interface 514, an RF interface 515, and a memory controller 516.

Further, in the RF circuit 501, the power supply circuit 504 includes a rectifier circuit and a storage capacitor, and has a function of generating power supply voltage from received signals and applying the power supply voltage to other circuits. In addition, the demodulation circuit 505 includes a rectifier circuit and an LPF (low-pass filter) and has a function of extracting a command or data from communication signals. The modulation circuit 506 has a function of modulating transmission data, and the modulated data is transmitted as a transmission signal from the antenna 517.

Next, operation of a semiconductor device of this embodiment will be described. First, signals transmitted from an external communication device are received by the semiconductor device. The reception signal input to the semiconductor device is demodulated by the demodulation circuit 505 and then output to the RF interface 515 in the controller 513. The reception signal that is input to the RF interface 515 is processed arithmetically by the CPU 510 through the CPU interface 514. Further, the reception signal input to the RF interface 515 may access the ROM 511 and the RAM 512 through the memory controller 516 in response to.

Then, transmission data is generated after arithmetic processing is performed by the CPU 510 and data in the ROM 511 and the RAM 512 is input and output, the transmission data is modulated as a signal by the modulation circuit 506 and is transmitted from the antenna 517 to the external communication device.

The design system of a functional circuit or the method for designing a functional circuit, which is one embodiment of the present invention, is suitable for the design of the logic circuit or the like of the semiconductor device. By employing the design system of the functional circuit or the design method of the functional circuit, which is one embodiment of the present invention, a logic circuit with a small circuit scale and low power consumption can be designed.

Further, the above-described semiconductor device is used for a variety of purposes. Usage examples of the above-described semiconductor device will be described with reference to FIGS. 9A to 9F. FIGS. 9A to 9F are schematic views illustrating usage examples of the semiconductor device.

Figure 9A:
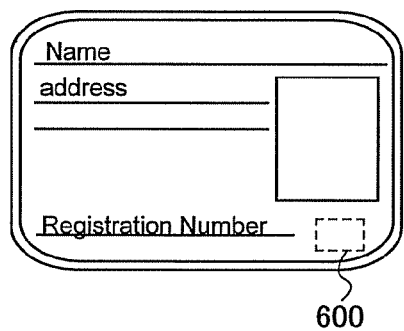
FIGS. 9A to 9F are diagrams each illustrating a usage example of a semiconductor device in Embodiment 2.
Figure 9B:
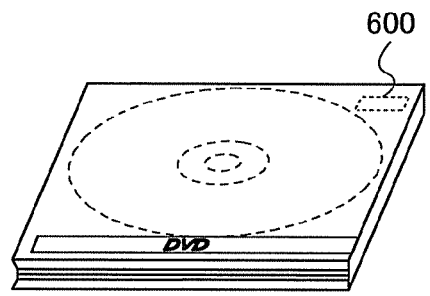
Figure 9C:
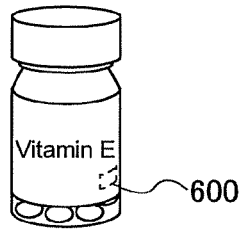
Figure 9D:
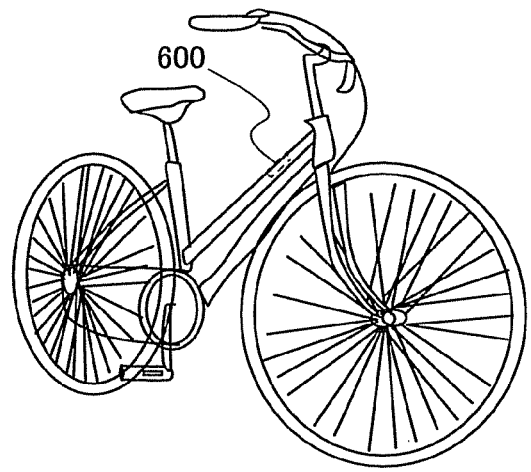
Figure 9E:
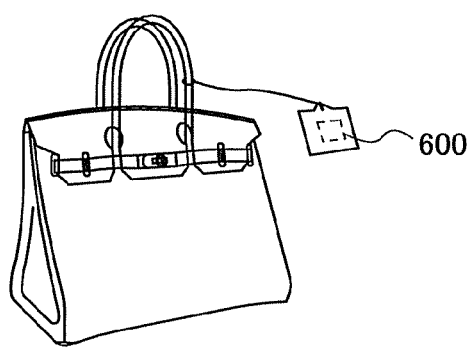
Figure 9F:
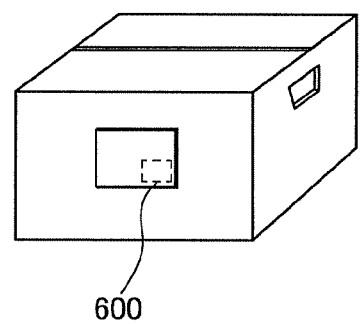

As illustrated in FIGS. 9A to 9F, the semiconductor device can be used widely and can be used by being provided for, for example, bills, coins, securities, bearer bonds, certificates (e.g., driver's licenses or resident cards, see FIG. 9A), or objects such as containers for wrapping (e.g., wrapping paper or bottles, see FIG. 9C), recording media (e.g., DVDs or video tapes, see FIG. 9B), vehicles (e.g., bicycles, see FIG. 9D), personal belongings (e.g., bags or glasses), foods, plants, animals, clothes, livingwares, or electronic devices (e.g., liquid crystal display devices, EL display devices, television sets, or mobile phones), or shipping tags of the objects (see FIGS. 9E and 9F).

A semiconductor device 600 is fixed to an object by being mounted on a printed board, attached to a surface, or embedded therein. For example, the semiconductor device is incorporated in paper of a book or an organic resin of a package to be fixed in each object. Since the semiconductor device 600 achieves reduction in size, thickness, and weight, an attractive design of the object itself is not spoiled even after the semiconductor device 600 is fixed to the object. In addition, when the semiconductor device 600 is provided for bills, coins, securities, bearer bonds, certificates, or the like, a certification function can be provided, and forgery thereof can be prevented by utilizing the certification function. Furthermore, by providing the semiconductor device 600 for containers for wrapping objects, recording media, personal belongings, foods, clothes, livingwares, electronic devices, and the like, a system such as an inspection system can be carried out efficiently. Even vehicles can have higher security against theft or the like by being provided with the semiconductor device 600.

As described above, since power consumption and a circuit area of the semiconductor device provided with the circuit that is designed by one embodiment of the present invention can be reduced, the semiconductor device can be used for a variety of purposes without limitation on size from small to large; the semiconductor device can be used for a small object such as a coin and also a large object such as an electronic device. Further, by using the semiconductor device for a variety of purposes, the correct value of data used for information communication can be maintained. Therefore, authentication and reliability of security of an object can be improved.

Note that this embodiment can be combined with any of the other embodiments as appropriate.

[Embodiment 3]

In this embodiment, a display device will be described as an example of a device provided with a circuit which can be designed by the design system of a functional circuit or the method for designing a functional circuit, according to one embodiment of the present invention.

Figure 10:
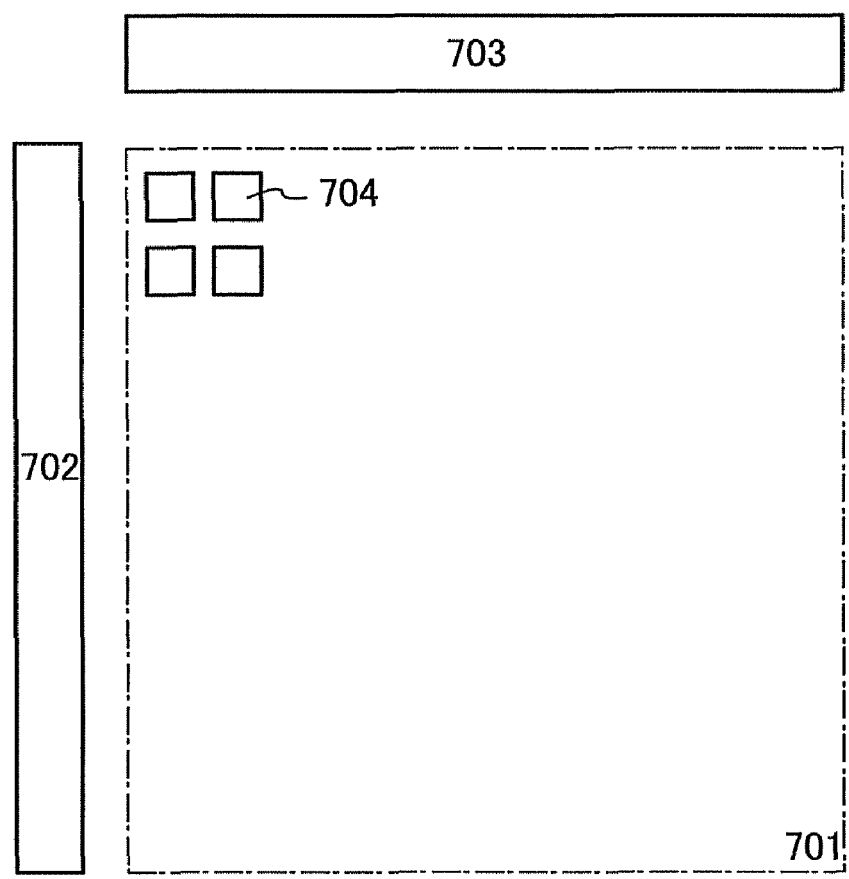
FIG. 10 is a block diagram illustrating a structure of a display device provided with a circuit designed by the present invention in Embodiment 3.

First, a structure of a display device of this embodiment is described with reference to FIG. 10. FIG. 10 is a block diagram illustrating a structure of the display device of this embodiment.

As shown in FIG. 10, the display device of this embodiment includes a pixel portion 701, a scanning line driver circuit 702, and a signal line driver circuit 703.

The pixel portion 701 includes a plurality of pixels 704 and has a so-called dot matrix structure in which the plurality of pixels 704 is provided in the column and row directions. Each pixel is electrically connected to the scanning line driver circuit 702 through a scanning line (not shown) and to the signal line driver circuit 703 through a signal line (not shown).

The scanning line driver circuit 702 selects the pixel 704 to which data is written and outputs a selection signal to the pixel through the scanning line.

The signal line driver circuit 703 outputs data to be written to the pixel 704 as a signal and outputs a data signal through the signal line to the pixel 704 selected by the scanning line driver circuit 702.

Next, examples of structures of a scanning line driver circuit and a signal line driver circuit of the display device in this embodiment are described.

Figure 11A:
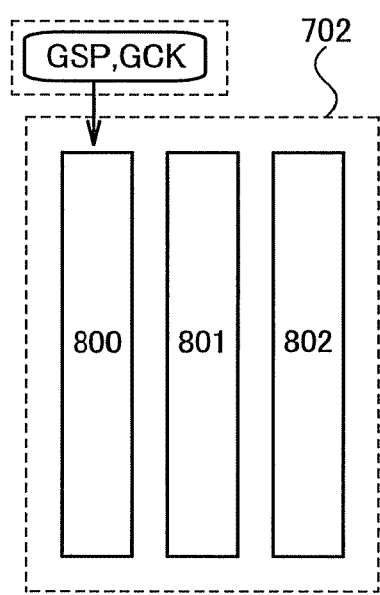
FIGS. 11A and 11B are block diagrams illustrating structures of driver circuits of a display device in Embodiment 3.

First, an example of a structure of the scanning line driver circuit is described with reference to FIG. 11A. FIG. 11A is a block diagram illustrating an example of a structure of the scanning line driver circuit in the display device of this embodiment.

As shown in FIG. 11A, the scanning line driver circuit 702 in FIG. 11A includes a shift register 800, a level shifter 801, and a buffer 802.

A signal such as a gate start pulse (GSP) or a gate clock signal (GCK) is input to the shift register 800.

Figure 11B:
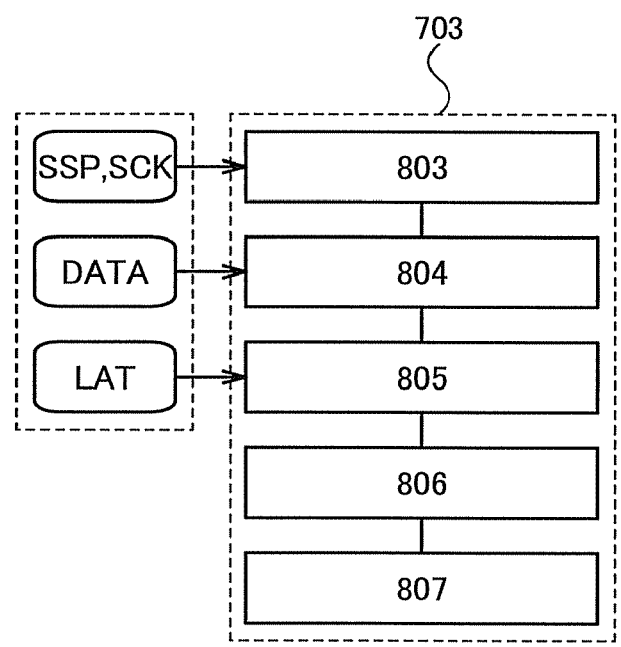

Next, an example of a structure of the signal line driver circuit is described with reference to FIG. 11B. FIG. 11B is a cross-sectional view illustrating an example of a structure of the signal line driver circuit in the display device of this embodiment.

As shown in FIG. 11B, the signal line driver circuit 703 in FIG. 10 includes a shift register 803, a first latch circuit 804, a second latch circuit 805, a level shifter 806, and a buffer 807.

The buffer 807 has a function of amplifying a signal and includes an operational amplifier or the like. Signals such as a start pulse (SSP) is input to the shift register 803, and data (DATA) of a video signal or the like is input to the first latch circuit 804. The second latch circuit 805 can hold a latch (LAT) signal temporally and output the held latch signals all at once to the pixel portion 701 in FIG. 10. This operation is referred to as a line sequential drive. Therefore, when the pixel performs dot sequential drive instead of the line sequential drive, the second latch circuit 805 is not necessary.

One embodiment of the present invention is suitable for the design of the above-described shift register 800 or the like. The design becomes easy by employing one embodiment of the present invention.

The above-described display device can be used for a display portion of a variety of electronic devices. Specific examples of electronic devices in which the above-described display device is incorporated will be shown with reference to FIGS. 12A to 12H. FIGS. 12A to 12H illustrate structures of electronic devices of this embodiment.

Figure 12A:
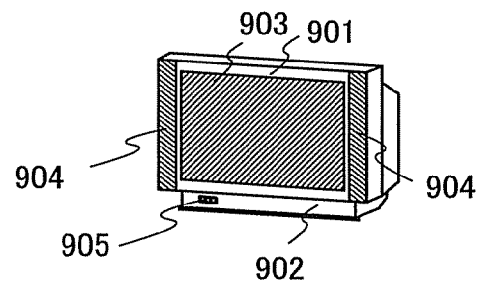
FIGS. 12A to 12H illustrate electronic devices whose display portions include display devices in Embodiment 3.

FIG. 12A illustrates a display device including a housing 901, a supporting base 902, a display portion 903, speaker portions 904, a video input terminal 905, and the like. The above-described display device can be applied to the display portion 903. Note that the display device may be any display device for a personal computer, for TV broadcast reception, for advertisement display, or the like.

Figure 12B:
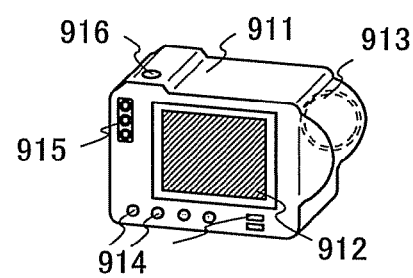

FIGS. 12B illustrates a digital still camera including a main body 911, a display portion 912, an image receiving portion 913, operation keys 914, an external connection port 915, a shutter button 916, and the like. The above-described display device can be applied to the display portion 912.

Figure 12C:
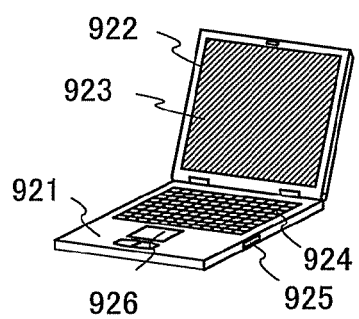

FIG. 12C illustrates a notebook personal computer including a main body 921, a housing 922, a display portion 923, a keyboard 924, an external connection port 925, a pointing device 926, and the like. The above-described display device can be applied to the display portion 923.

Figure 12D:
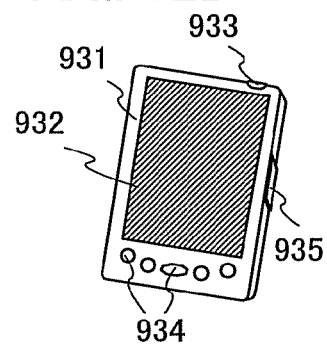

FIG. 12D illustrates a mobile computer including a main body 931, a display portion 932, a switch 933, operation keys 934, an infrared port 935, and the like. The above-described display device can be applied to the display portion 932.

Figure 12E:
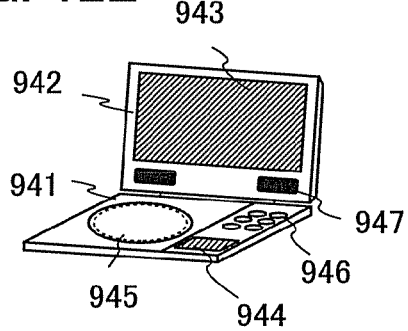

FIG. 12E illustrates a portable image reproducing device provided with a recording medium (specifically, a DVD reproducing device), which includes a main body 941, a housing 942, a display portion A943, a display portion B944, a recording medium (such as a DVD) reading portion 945, operation keys 946, speaker portions 947, and the like. The display portion A943 mainly displays image data, while the display portion B944 mainly displays text data. The above-described display device can be used for the display portion A943 and the display portion B944. Note that the image reproducing device provided with a recording medium includes a home game machine and the like.

Figure 12F:
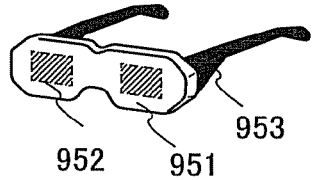

FIG. 12F illustrates a goggle type display (a head mounted display) including a main body 951, a display portion 952, an arm portion 953, and the like. The above-described display device can be applied to the display portion 952.

Figure 12G:
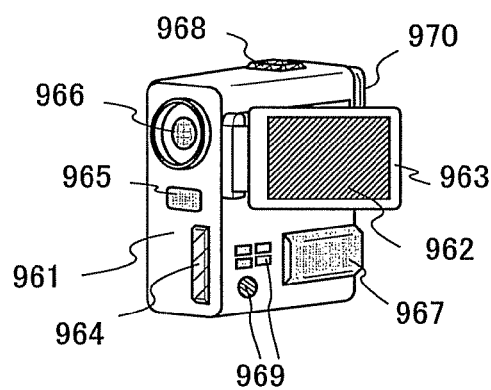

FIG. 12G illustrates a video camera including a main body 961, a display portion 962, a housing 963, an external connection port 964, a remote control receiving portion 965, an image receiving portion 966, a battery 967, an audio input portion 968, operation keys 969, and eye piece 970, and the like. The above-described display device can be applied to the display portion 962.

Figure 12H:
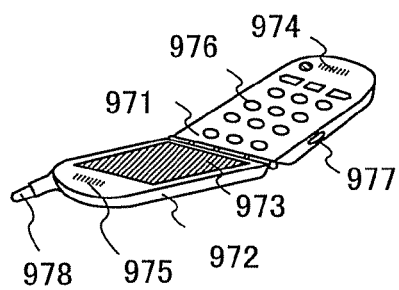

FIG. 12H illustrates a cell phone including a main body 971, a housing 972, a display portion 973, an audio input portion 974, an audio output portion 975, operation keys 976, an external connection port 977, an antenna 978, and the like. The above-described display device can be applied to the display portion 973. Note that the display portion 973 displays white text on black screen so that current consumption of the cell phone can be suppressed.

In this manner, the above-described display device can be used as the display portion of a variety of electronic devices as above. By using the display device provided with the circuit designed by one embodiment of the present invention as the display portion, an electronic device with a smaller circuit area and low power consumption can be provided.

Note that this embodiment can be combined with any of the other embodiments as appropriate.

EXAMPLE 1

In Example 1, the design of a functional circuit, which is provided with a counter circuit, with the design system of a functional circuit according to one embodiment of the present invention will be described.

The design of the functional circuit provided with a counter circuit in Example 1 will be described. Note that the description in FIG. 3, FIG. 4, FIG. 5, FIG. 6, and FIG. 7 is quoted for description.

First, the hierarchizing means 101 is executed and a hierarchizing process is performed by using the RTL description 109 and the assigned circuit information 110. At that time, the RTL description 109 includes a description indicating a first synchronous 2-bit counter circuit, a description indicating a second synchronous 2-bit counter circuit, and a description indicating the other synchronous unit circuits. The assigned circuit information 110 includes a description in which a synchronous 2-bit counter circuit is selected. Through the hierarchizing process, in the RTL description 109, each of the description indicating the first synchronous 2-bit counter circuit, the description indicating the second synchronous 2-bit counter circuit, and the description indicating the other synchronous unit circuits is blocked; the RTL description 109 is converted into a hierarchized RTL description in which the description indicating the blocked description indicating first synchronous 2-bit counter circuit, the blocked description indicating the second synchronous 2-bit counter circuit, and the blocked description indicating the other synchronous unit circuits are in one class. Note that the hierarchized RTL description is different from the RTL description 109 before the hierarchization only in the existence of a class, and represents the same circuit function as the RTL description 109 before the hierarchization. Note that PIN information of a circuit in a lower class and a circuit in a higher class, which is indicated by the description indicating the first synchronous 2-bit counter circuit and the description indicating the second synchronous 2-bit counter circuit is required for hierarchization. However, here, the PIN information is obtained when the RTL description 109 is searched for a description which corresponds to the assigned circuit information 110.

Next, the first logic synthesis means 102 is executed by using the hierarchized RTL description, constraint conditions such as the area of a chip or a delay time, a library's cell of the semiconductor manufacturing technology, and the like to perform the first logic synthesis process. A net list at the gate level which is functionally equivalent to the RTL description 109 is generated by the first logic synthesis process, and the net list is output to the first placement and routing means 103. Note that the description indicating the first synchronous 2-bit counter circuit and the description indicating the second synchronous 2-bit counter circuit exist in a lower class in the output net list, so that a hierarchy is maintained.

Next, the first placement and routing means 103 is executed by using the net list input from the first logic synthesis means 102, constraint conditions such as the area of a chip or a delay time, a library's cell of the semiconductor manufacturing technology, and the like to perform the first placement and routing process. At that time, it is preferable that elements included in the first synchronous 2-bit counter circuit are provided as close as possible to each other in a layout by the first placement and routing process. In addition, similarly, it is preferable that elements included in the second synchronous 2-bit counter circuit are provided as close as possible in the layout. The layout is formed with that state, a net list at the gate level is generated, and then the generated net list is output to the second substitution means 108. Further, circuit information such as wiring connection information, gate capacitance, or parasitic capacitance loaded on a wiring, or timing information of an input/output terminal of each unit circuit in the lower class is output. Furthermore, the timing information of the input/output terminal of each unit circuit in the lower class includes a description of a delay state of each unit circuit in the lower class, gate capacitance loaded on the input/output terminal of each unit circuit in the lower class, and parasitic capacitance loaded on a wiring.

At that time, in Example 1, it is assumed that the timing information of the input/output terminal of each unit circuit in the lower class has a timing margin of a predetermined value between a sequential circuit in an upper stage, which is connected to an input terminal of the first synchronous 2-bit counter circuit, and a sequential circuit in a lower stage, which is connected to an output terminal of the first synchronous 2-bit counter circuit. To have a timing margin means that delay of data line, which connects the sequential circuits in the upper stage and lower stage, to a clock cycle of the sequential circuits in the upper stage and lower stage is within a range in which substitution for an asynchronous circuit in the second substitution process is possible. In addition, it is assumed that the timing information of the input/output terminal of each unit circuit in the lower class does not have a timing margin of a predetermined value between a sequential circuit in an upper stage, which is connected to an input terminal of the second synchronous 2-bit counter circuit, and a sequential circuit in a lower stage, which is connected to an output terminal of the second synchronous 2-bit counter circuit.

Further, in output delay information, which is included in the timing information of the input/output terminal of each unit circuit in the lower class output from the first placement and routing means 103, of gate capacitance loaded on the input/output terminal of each unit circuit in the lower class, parasitic capacitance loaded on a wiring, or the like, a delay value of a part which corresponds to the first synchronous 2-bit counter circuit is within a predetermined range and a delay value of a part which corresponds to the second synchronous 2-bit counter circuit is out of the predetermined range.

Next, after the hierarchizing process, the first substitution means 104 is executed by using the blocked description indicating the first synchronous 2-bit counter circuit, the blocked description indicating the second synchronous 2-bit counter circuit, and the blocked description indicating the other synchronous functional circuits, to perform the first substitution process. The description indicating the asynchronous 2-bit counter circuit is substituted for the description indicating the first synchronous 2-bit counter circuit and the description indicating the second synchronous 2-bit counter circuit by the first substitution process and is output to a file.

Next, the second logic synthesis means 105 is executed by using the file generated in the first substitution means 104, constraint conditions such as the area of a chip or a delay time, a library's cell of the semiconductor manufacturing technology, and the like to perform a second logic synthesis process. A net list at the gate level is generated by the second logic synthesis process and the generated net list is output to the second placement and routing means 106.

Next, the second placement and routing means 106 is executed by using the net list input from the second logic synthesis means 105, constraint conditions such as the area of a chip or a delay time, a library's cell of the semiconductor manufacturing technology, and the like to perform the second placement and routing process. By the second placement and routing process, a layout is generated and a net list at the gate level is further generated. Then, the generated net list is output to the calculation means 107. In addition, circuit information such as wiring connection information, gate capacitance, or parasitic capacitance which is loaded on a wiring is also output to the calculation means 107.

Next, the calculation means 107 is executed by a circuit simulator such as SPICE with the use of the circuit information output from the second placement and routing means 106 and the net list input from the second placement and routing means 106 to perform in a calculation process. Through the calculation process, output delay information corresponding to the input net list is obtained, and the result thereof is output as a data table to a file.

Next, the second substitution means 108 is executed to perform the second substitution process. In a layout, the asynchronous circuit placed by the second placement and routing means 106 is substituted for a selected circuit placed by the first placement and routing means 103 based on the file input from the calculation means 107 by the second substitution process. In Example 1, since a delay value of the part which corresponds to the first synchronous 2-bit counter circuit is smaller as compared to a delay state of the first synchronous 2-bit counter circuit input from the first placement and routing means 103, the asynchronous 2-bit counter circuit is substituted for the first synchronous 2-bit counter circuit. On the other hand, since a delay value of a part which corresponds to the second synchronous 2-bit counter circuit is smaller as compared to a delay state of the second synchronous 2-bit counter circuit input from the first placement and routing means 103, the asynchronous 2-bit counter circuit is not substituted for the second synchronous 2-bit counter circuit.

Further, timing verification is performed again with a layout in which substitution has been completed so that whether a set-up time, a hold time, or the like corresponds to a desired timing specification or not is checked. If the set up time, the hold time, or the like corresponds to the desired timing specification, design is completed.

Figure 13A:
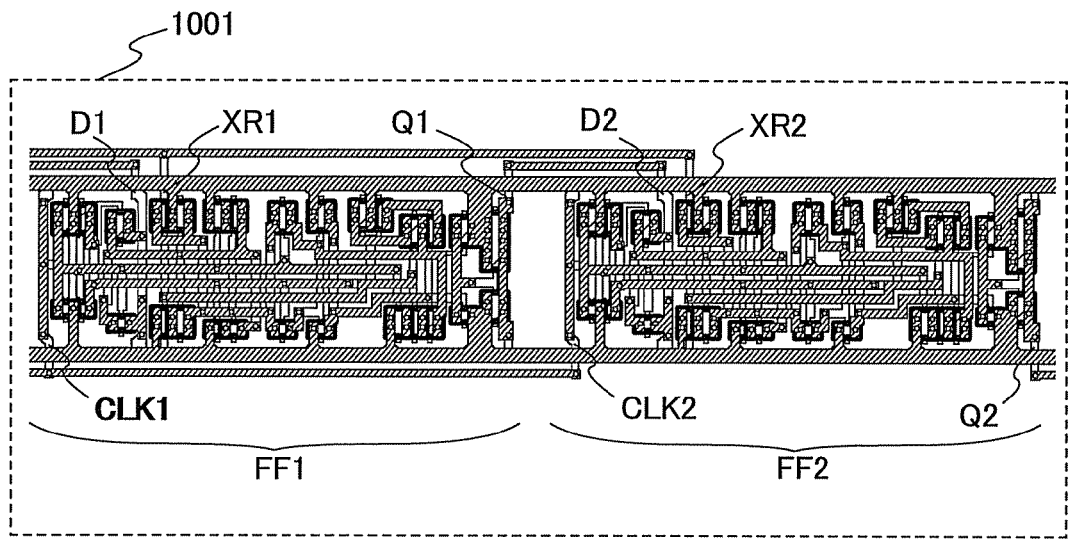
FIGS. 13A and 13B are top views of a counter circuit in Example 1.
Figure 13B:
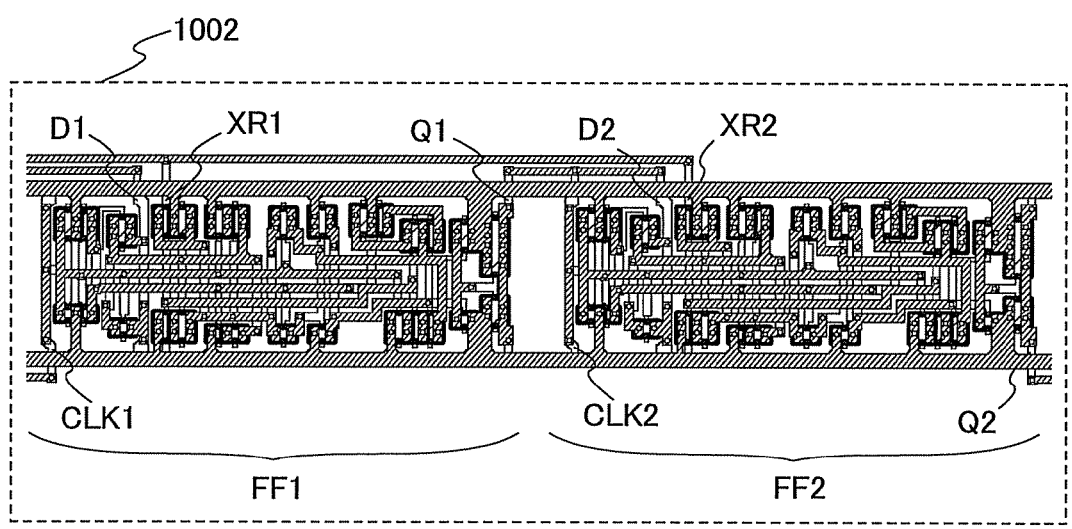
Figure 14:
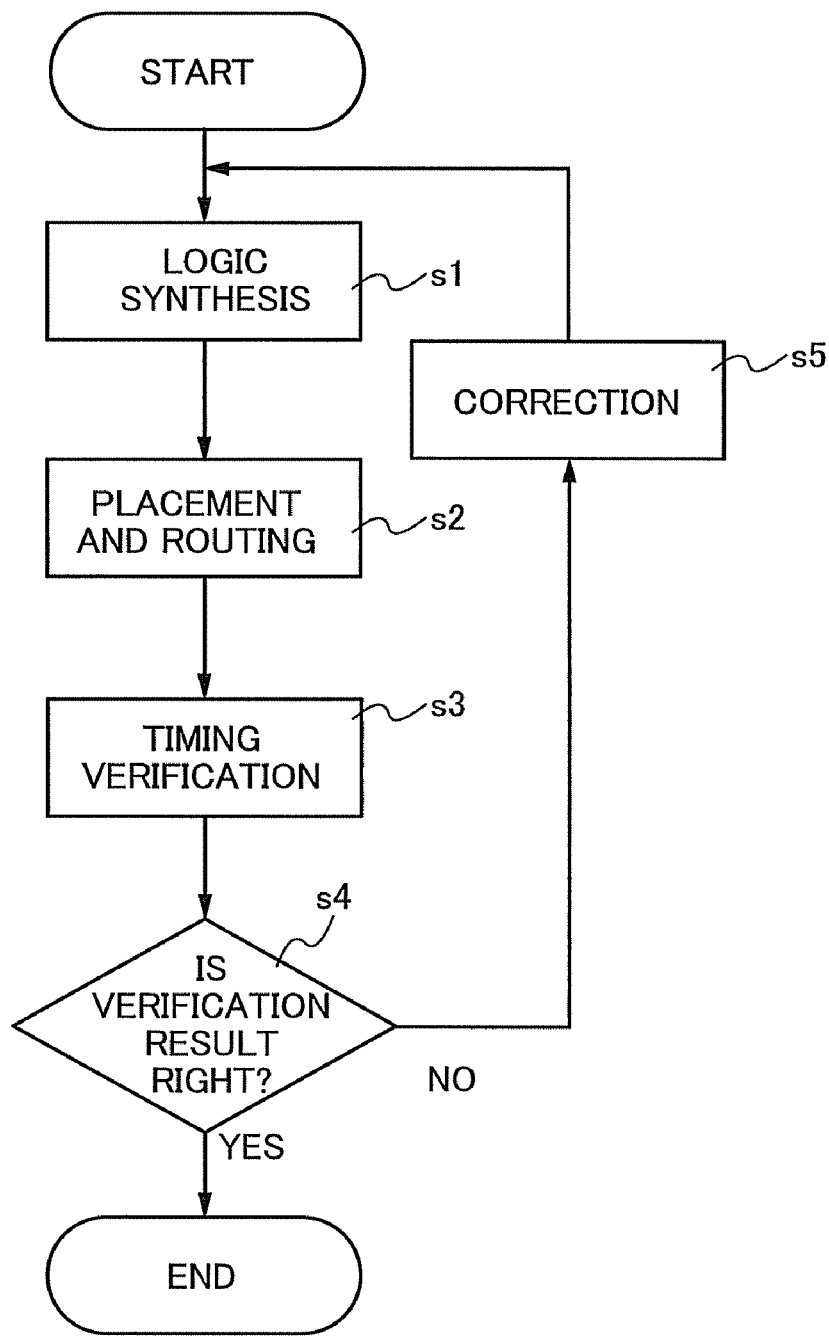
FIG. 14 is a flow chart illustrating a method for designing a conventional synchronous circuit.
Figure 15:
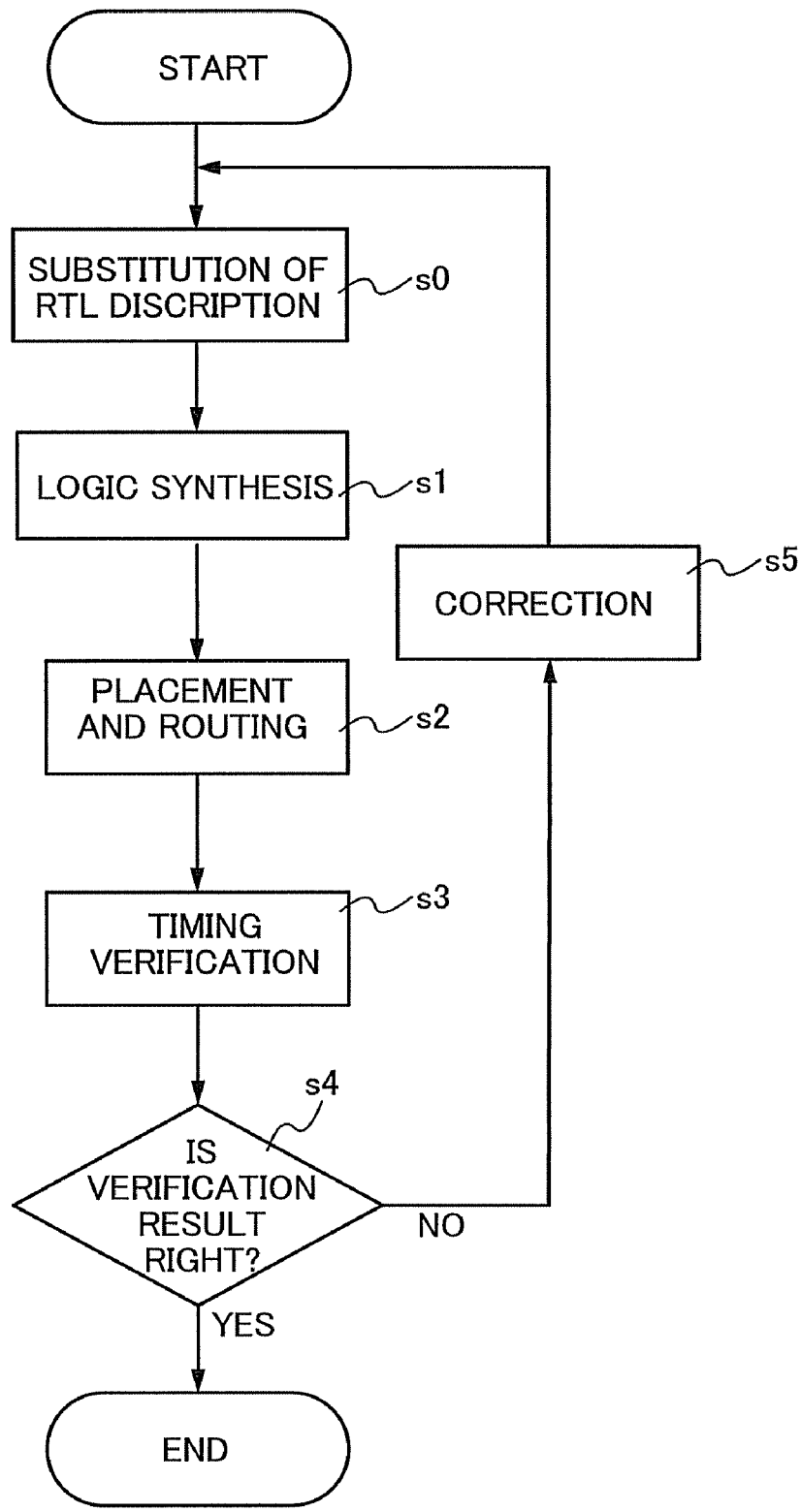
FIG. 15 is a flow chart illustrating a method for designing a conventional asynchronous substitutional functional circuit.

Furthermore, a structure of the counter circuit after the second substitution process is described with reference to FIGS. 13A and 13B. FIGS. 13A and 13B are top views illustrating the structure of the counter circuit. Note that a combination circuit of sequential circuits is omitted in FIGS. 13A and 13B for convenience.

FIG. 13A illustrates a synchronous 2-bit counter circuit. A synchronous counter circuit 1001 includes a sequential circuit FF1 and a sequential circuit FF2. An input terminal D2 of the sequential circuit FF2 is electrically connected to an output terminal Q1 of the sequential circuit FF1 through a wiring, a clock signal input terminal CLK2 of the sequential circuit FF2 is electrically connected to a clock signal input terminal CLK1 of the sequential circuit FF1 through a wiring, and a reset signal input terminal XR2 of the sequential circuit FF2 is electrically connected to a reset signal input terminal XR1 of the sequential circuit FF1 through a wiring.

(0116)
FIG. 13B illustrates the counter circuit after the second substitution process. A counter circuit 1002 includes the sequential circuit FF1 and the sequential circuit FF2. The input terminal D2 of the sequential circuit FF2 is electrically connected to the output terminal Q1 of the sequential circuit FF1 through the wiring, the clock signal input terminal CLK2 of the sequential circuit FF2 is electrically connected to an output terminal D1 of the sequential circuit FF1 through a wiring, and the reset signal input terminal XR2 of the sequential circuit FF2 is electrically connected to the reset signal input terminal XR1 of the sequential circuit FF1 through the wiring.

As described above, the 2-bit counter circuit shown in FIG. 13B is substituted for the synchronous 2-bit counter circuit shown in FIG. 13A by the second substitution process. Note that the 2-bit counter circuit shown in FIG. 13B is an asynchronous counter circuit.

As described above, a functional circuit provided with an asynchronous counter circuit can be designed by using the design system of the functional circuit, which is one embodiment of the present invention.

This application is based on Japanese Patent Application serial No. 2008-247509 filed with Japan Patent Office on Sep. 26, 2008, the entire contents of which are hereby incorporated by reference.

What is claimed is:

1. A system for designing a functional circuit, comprising:
   a hierarchizing means for extracting a second description representing a synchronous unit circuit from a first description representing a functional circuit at register transfer level, blocking the second description, and converting the first description into a third description which is hierarchized with a use of a blocked second description as one class;
   a first logic synthesis means for generating a first net list by logic synthesis of the third description;
   a first placement and routing means for performing placement and routing based on the first net list;
   a first substitution means for substituting a fourth description indicating an asynchronous unit circuit for the blocked second description indicating the synchronous unit circuit;
   a second logic synthesis means for generating a second net list by logic synthesis of the fourth description;
   a second placement and routing means for performing placement and routing based on the second net list;
   a calculation means for calculating delay information corresponding to the second net list from circuit information determined by the second placement and routing means; and
   a second substitution means for selectively substituting the asynchronous unit circuit on which placement and routing is performed by the second placement and routing means for the synchronous unit circuit on which placement and routing is performed by the first placement and routing means based on a calculation result by the calculation means, and for performing timing verification with a layout in which the selective substitution is completed,
   wherein the second substitution means is configured to selectively substitute process again if the layout has any malfunction.

2. The system for designing a functional circuit, according to claim 1, wherein each of the synchronous unit circuit and the asynchronous unit circuit is a counter circuit including a sequential circuit.

3. A method for manufacturing a functional circuit, comprising the steps of:
   extracting a second description indicating a synchronous unit circuit from a first description representing a functional circuit register transfer level;
   blocking the second description;
   converting the first description into a third description which is hierarchized with a use of a blocked second description as one class;
   generating a first net list by logic synthesis of the third description;
   performing a first placement and routing process based on the first net list;
   substituting a fourth description indicating an asynchronous unit circuit for the blocked second description indicating the synchronous unit circuit;
   generating a second net list by logic synthesis of the fourth description;

performing a second placement and routing process based on the second net list;

performing a calculation process of the asynchronous unit circuit on which the second placement and routing process is performed;

selectively substituting the asynchronous unit circuit on which the second placement and routing process is performed for the synchronous unit circuit on which the first placement and routing process is performed based on a calculation result of the calculation process, and performing timing verification with a layout in which the selective substitution is completed; and forming a circuit based on the layout, wherein the selectively substituting step is performed again if the layout has any malfunction.

4. The method for manufacturing a functional circuit, according to claim 3, wherein each of the synchronous unit circuit and the asynchronous unit circuit is a counter circuit including a sequential circuit.

5. The method for manufacturing a functional circuit, according to claim 3, wherein timing verification is performed by the first placement and routing process on the synchronous unit circuit on which placement and routing is performed by the first placement and routing process.

6. The method for manufacturing a functional circuit, according to claim 3, wherein timing verification is performed by the calculation process on the asynchronous unit circuit on which placement and routing is performed by the second placement and routing process.

* * * * *